United States Patent
Sanada et al.

(10) Patent No.: US 7,264,848 B2
(45) Date of Patent: Sep. 4, 2007

(54) NON-CYANIDE ELECTROLESS GOLD PLATING SOLUTION AND PROCESS FOR ELECTROLESS GOLD PLATING

(75) Inventors: Masaki Sanada, Nagano (JP); Masao Nakazawa, Nagano (JP); Kei Imafuji, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 36 days.

(21) Appl. No.: 11/226,132

(22) Filed: Sep. 14, 2005

(65) Prior Publication Data

US 2006/0062927 A1 Mar. 23, 2006

(30) Foreign Application Priority Data

Sep. 17, 2004 (JP) .............................. 2004-271112
Jan. 12, 2005 (JP) .............................. 2005-005266

(51) Int. Cl.
*B05D 1/18* (2006.01)
*B05D 3/10* (2006.01)
*C23C 18/18* (2006.01)
*C23C 18/32* (2006.01)
*C23C 18/42* (2006.01)

(52) U.S. Cl. ................. 427/443.1; 106/1.23; 106/1.26; 427/305; 427/438

(58) Field of Classification Search ............... 106/1.23, 106/1.26; 427/443.1, 305, 438
See application file for complete search history.

(56) References Cited

U.S. PATENT DOCUMENTS 5,338,343 A * 8/1994 Kroll et al. ................. 106/1.23
5,470,381 A * 11/1995 Kato et al. .................. 106/1.23
6,165,342 A    12/2000 Kuhn et al.
6,235,093 B1 * 5/2001 Okuhama et al. .......... 106/1.18
6,798,032 B2 * 9/2004 Izumi et al. ................. 257/443
7,022,169 B2 * 4/2006 Iwai et al. .................. 106/1.23
2003/0047108 A1 * 3/2003 Hayashi et al. ............ 106/1.23
2005/0092616 A1 * 5/2005 Hu et al. ..................... 205/266

FOREIGN PATENT DOCUMENTS

JP      10-317157    * 12/1998
JP   2003-342742    * 12/2003

OTHER PUBLICATIONS

Abstract of JP2003-342742, Dec. 2003.*
Abstract of JP10-317157, Dec. 1998.*
English translation of JP 2003/342742, Dec. 2003.*
Hyomen Gijutsu (Surface Finishing), vol. 52, No. 5, 2001 (pp. 410-413). (Discussed on p. 3 of specification.), no month available.
Hyomen Gijutsu (Surface Finishing), vol. 46, No. 9, 1995 (pp. 775-777). (Discussed on pp. 3-4 of specification.), no month available.

* cited by examiner

*Primary Examiner*—Helene Klemanski
(74) *Attorney, Agent, or Firm*—Rankin, Hill, Porter & Clark LLP (57) ABSTRACT

The present invention provides a non-cyanide electroless gold plating solution free from a cyanide compound, comprising, as a completing agent of gold, a compound represented by the formula shown below or a salt thereof:

X—(CH$_2$)$_n$—SH wherein n is 2 or 3 and X is SO$_3$H or NH$_2$, and having a pH value of 7 or less. The invention also provides a process for electroless gold plating using the non-cyanide electroless gold plating solution.

5 Claims, 7 Drawing Sheets

PAD FAILURE — Mode 1
BALL FAILURE — Mode 2
BALL EXTRUDED — Mode 3
} OK

BOND FAILURE — Mode 4 } NG

NON-CYANIDE ELECTROLESS GOLD PLATING SOLUTION AND PROCESS FOR ELECTROLESS GOLD PLATING

FIELD OF THE INVENTION

The present invention relates to a non-cyanide electroless gold plating solution and a process for electroless gold plating.

BACKGROUND OF THE INVENTION

Figure 1:
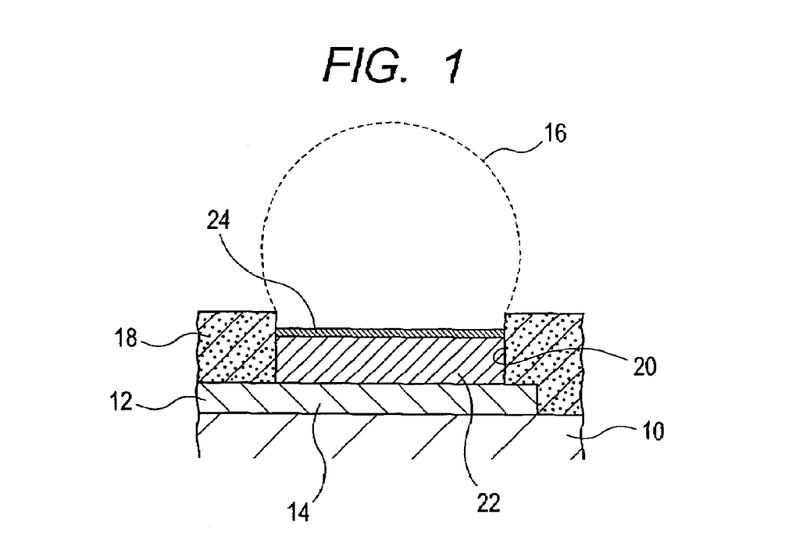
FIG. 1 is an explanatory drawing illustrating the portion of a substrate to be subjected to electroless gold plating.

The process for producing a semiconductor device includes a step mounting a solder ball 16 as an external connecting terminal on a pad 14 constituting an end part of a wiring pattern 12 made of copper and formed on one surface of a substrate 10, as shown in FIG. 1.

At the formation of such a solder ball 16 on the pad 14 made of copper, a resinous mask layer 18 such as a solder resist is first formed on one surface of the substrate 10 and then a concave portion 20 where a pad surface is exposed at the bottom is formed in the mask layer 18 by laser or the like.

Then, in the concave portion 20, after a metal layer 22 made of Ni—P is formed as an underlying layer by electroless nickel plating, the substrate 10 is dipped in an electroless gold plating solution in order to form a gold layer 24 thinner than the metal layer 22 on the upper surface of the metal layer 22 by immersion gold plating.

Thereafter, by placing a solder ball on the gold layer 24 and reflowing, gold is diffused into the solder and an alloy of Ni—P of the metal layer 22 with the solder is formed, thereby firmly fixing the solder ball 16 as an external connecting terminal.

As the electroless gold plating solution in which the substrate 10 is dipped at the time of immersion gold plating for forming the gold layer, there has been hitherto employed a cyanide-containing electroless gold plating solution to which a cyanide complex such as $KAu(CN)_2$ as a gold source.

However, since the cyanide-containing electroless gold plating solution is generally used in an alkaline region condition, the resinous mask layer 18 such as a solder resist is apt to be eroded when the substrate 10, one surface of which is covered with the mask layer 18, is dipped in the cyanide-containing electroless gold plating solution.

Moreover, with regard to the cyanide-containing electroless gold plating solution, special care should be taken in its handling owing to its toxicity and also usual water treatment are necessary for detoxifying it in the case of its disposal.

Instead of such a conventional cyanide-containing electroless gold plating solution, a non-cyanide electroless gold plating solution free from a cyanide compound is proposed in Non-Patent Document 1 specified below.

In such a non-cyanide electroless gold plating solution, a gold sulfite complex is added as a gold source in order to stabilize gold ion in the electroless gold plating solution.

Non-Patent Document 1: Hyomen Gijutsu (Surface Finishing), vol. 52, No. 5, 2001 (pages 410 to 413)

The non-cyanide electroless gold plating solution containing a gold sulfite complex as a gold source mentioned above can solve the above-noted difficulty in handling because of the toxicity.

However, since such a non-cyanide electroless gold plating solution is still used in an alkaline region condition, the resinous mask layer 18 such as a solder resist is apt to be eroded when the substrate 10, one surface of which is covered with the mask layer 18, is dipped in the non-cyanide electroless gold plating solution.

Furthermore, the non-cyanide electroless gold plating solution containing a gold sulfite complex as a gold source is extremely low in stability as described in Hyomen Gijutsu (Surface Finishing), vol. 46, No. 9, 1995 (pages 775-777). Therefore, the electroless gold plating solution should be remade frequently.

SUMMARY OF THE INVENTION

Accordingly, an object of the invention is to provide a non-cyanide electroless gold plating solution capable of being used in an acidic region condition and excellent in stability.

Another object of the invention is to provide a process for electroless gold plating using the non-cyanide electroless gold plating solution.

Other objects and effects of the invention will become apparent from the following description.

The present inventors have extensively studied considering that, for solving the above problems, it is important to select a complexing agent of gold, which combines with a gold ion to form a stable complex in an electroless gold plating solution. As a result, the inventors have found that a non-cyanide electroless gold plating solution to which sodium mercaptoethanesulfonate is added as a complexing agent of gold exhibits a sufficient stability and can be used in an acidic region condition, thus arriving at the invention.

That is, the invention relates to a non-cyanide electroless gold plating solution free from a cyanide compound, comprising, as a completing agent of gold, a compound represented by the formula shown below or a salt thereof:

wherein n is 2 or 3 and X is $SO_3H$ or $NH_2$, and having a pH value of 7 or less.

By adjusting the pH value of the electroless gold plating solution to an acidic range of 7 or less, the erosion of the resinous mask layer such as a solder resist can be prevented even when the substrate, one surface of which is covered with the mask layer, is dipped in the non-cyanide electroless gold plating solution.

In the invention, the completing agent is preferably sodium mercaptoethanesulfonate, sodium mercaptopropanesulfonate, or aminoethanethiol.

By adding thallium (Tl) as a grain refiner to the electroless gold plating solution, a deposition rate of gold can be improved.

Moreover, as a gold source, a gold sulfite salt or a chloroaurate salt can be suitably used.

Furthermore, the invention also relates to a process for electroless gold plating, comprising forming a gold layer, by electroless gold plating, on a surface of a metal layer exposed at a bottom of a concave portion that is opened in a resinous mask layer covering one surface of a substrate, wherein the electroless gold plating is carried out by dipping the substrate in the non-cyanide electroless gold plating solution according to claim 1.

In the invention, by forming the metal layer with an electroless nickel plating solution having a phosphorus content of 1 to 4% by weight, bond reliability with a solder ball can be improved when the solder ball is mounted on the gold layer formed on the metal layer by electroless gold plating.

Since the complexing agent of gold to be used in the non-cyanide electroless gold plating solution according to the invention forms a complex with gold as stable as a cyanide complex such as $KAu(CN)_2$, the stability of the non-cyanide electroless gold plating solution according to the invention is satisfactory.

Furthermore, the electroless gold plating solution according to the invention can be used in an acidic region condition. Therefore, even when a substrate, one surface of which is covered with a resinous mask layer such as a solder resist, is dipped in the non-cyanide electroless gold plating solution according to the invention, the erosion of the mask layer can be prevented.

Thus, the non-cyanide electroless gold plating solution according to the invention can prevent the erosion of the mask layer and also is excellent in stability. As a result, it can be suitably adopted in the step of electroless gold plating in the production process of semiconductor devices.

The reference numerals used in the drawings denote the followings, respectively.

10: Substrate
12: Wiring pattern
14: Pad
16: Solder ball
18: Mask layer
20: Concave portion
22: Metal layer
24: Gold layer
32: Intermetallic compound
34: P-rich layer

DETAILED DESCRIPTION OF THE INVENTION

In the non-cyanide electroless gold plating solution according to the invention, it is essential to add, as a complexing agent of gold, a compound represented by the formula shown below or a salt thereof:

wherein n is 2 or 3 and X is $SO_3H$ or $NH_2$.

As the complexing agent of gold, sodium mercaptoethanesulfonate, sodium mercaptopropanesulfonate, or aminoethanethiol can be suitably used. The amount of the complexing agent to be added is preferably from about 1.7 to 8.3 g/L.

Moreover, as a source of gold to be used in combination with the complexing agent of gold for use in the invention, a gold sulfite salt or a chloroaurate salt can be suitably used. The amount of the gold source to be added is preferably from about 0.75 to 1.25 g/L.

The gold complex formed in the non-cyanide electroless gold plating solution comprising a gold sulfite salt and sodium mercaptoethanesulfonate exhibits deposition potential close to that of $KAu(CN)_2$. This means that the complex of gold with mercaptoethanesulfonate is very stable.

Figure 2:
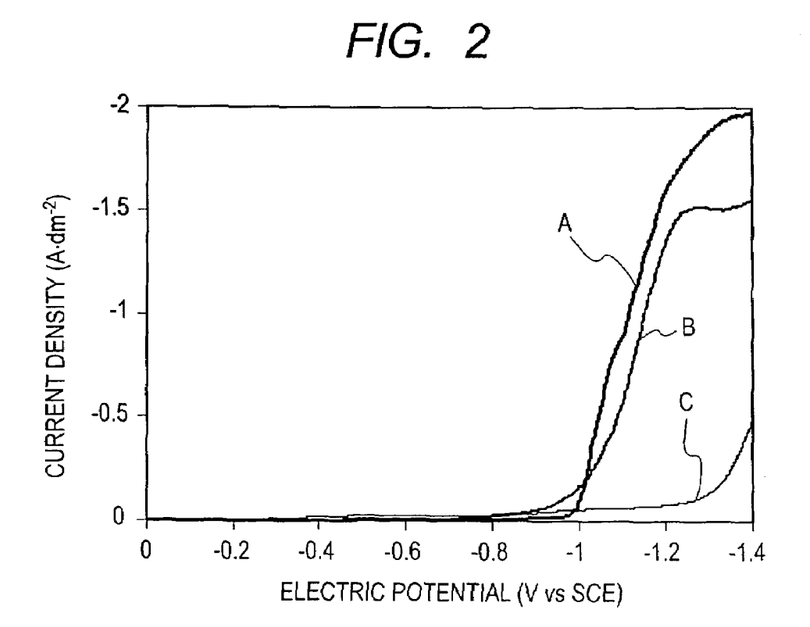
FIG. 2 is a graph illustrating deposition potential of the complex of mercaptoethanesulfonate with gold where the pH value is adjusted to 13.

This fact is shown in FIG. 2. In FIG. 2, Curve A shows deposition potential of the complex formed from the gold sulfite salt and sodium mercaptoethanesulfonate and Curve B shows deposition potential of $KAu(CN)_2$. In addition, Curve C exhibits, as a reference, hydrogen-generating potential of a citric acid solution to which gold is not added.

Such measurement of deposition potential was conducted using a platinum rotating electrode having subjected to electrolytic gold plating as a working electrode and using a platinum plate as a counter electrode, the platinum rotating electrode being rotated at 1000 rpm. As is apparent from FIG. 2, the deposition potential shown by Curve A extremely resembles the deposition potential shown by Curve B.

In this connection, the deposition potential shown in FIG. 2 was measured with adjusting the pH value of the electroless gold plating solution to 13 so as not to overlap with hydrogen-generating potential.

To the non-cyanide electroless gold plating solution according to the invention, a conductive salt which may be added to a conventional electroless gold plating solution, e.g., a citrate salt such as monopotassium citrate or tripotassium citrate can be added, and a pH adjuster such as potassium hydroxide can be added.

The non-cyanide electroless gold plating solution according to the invention is preferably adjusted with a pH adjuster to an acidic region of a pH value of 7 or lower, more preferably a pH value of 6 or lower, particularly preferably an acidic region of a pH value of 6 to 3.

Figure 3:
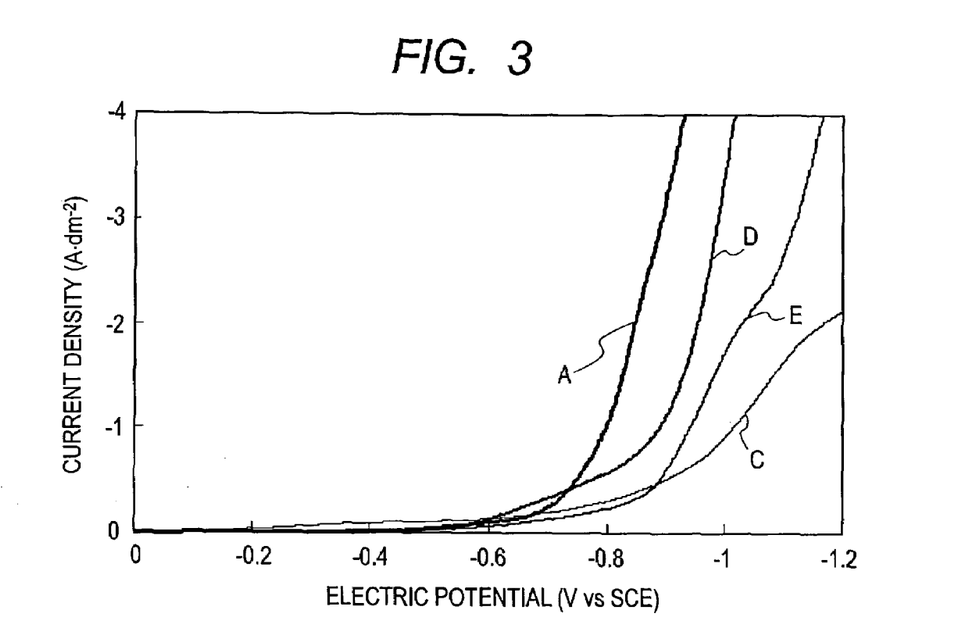
FIG. 3 is a graph illustrating deposition potential of the complex of mercaptoethanesulfonate, mercaptopropanesulfonate or aminoethanethiol with gold where the pH value is adjusted to 7.

With regard to the complexes of gold with the complexing agents of gold, such as sodium mercaptoethanesulfonate, sodium mercaptopropanesulfonate, and aminoethanethiol, deposition potential in the case that the pH value is adjusted to 7 is shown in FIG. 3.

In FIG. 3, Curve A shows deposition potential of the complex of sodium mercaptoethanesulfonate with gold, Curve D shows deposition potential of the complex of sodium mercaptopropanesulfonate with gold, and Curve E shows deposition potential of the complex of aminoethanethiol with gold. In addition, Curve C shows, as a reference, hydrogen-generating potential of a citric acid solution to which gold is not added.

As is shown in FIG. 3, with regard to the complexing agents of gold to be used in the invention, deposition potentials of the complexes thereof with gold are similar to each other even in the region of pH 7.

Therefore, from the deposition potential shown in FIG. 2 and FIG. 3, the complexing agents of gold to be used in the invention is considered to be able to form a stable complex with gold in an acidic region condition of a pH value of 7 or lower, exhibiting deposition potential close to deposition potential of $KAu(CN)_2$.

Incidentally, JP-T-11-513078 proposes a non-cyanide electrolytic gold plating solution to which a mercaptoethanesulfonate salt or a mercaptopropanesulfonate salt is added.

However, the non-cyanide electrolytic gold plating solution is to be used in the alkaline region condition of the pH value of 7 or higher and is not to be used in the acidic region condition of the pH value of 7 or lower.

When the substrate 10 as shown in FIG. 1 is dipped in a plating solution used in such an alkaline region condition of the pH value of 7 or higher, the resinous mask layer 18 such as a solder resist is apt to be peeled off.

With the non-cyanide electroless gold plating solution according to the invention adjusted to an acidic region condition, even when the substrate 10, one surface of which is covered with the resinous mask layer 18 such as a solder resist, is dipped therein, the mask layer 18 can be prevented from erosion.

Further, by adding thallium (Tl) as a grain refiner to the non-cyanide electroless gold plating solution according to the invention, the deposition rate of gold can be improved. Thallium (Tl) can be added in the form of thallium sulfate or thallium acetate.

In this connection, there is a tendency that the deposition rate of gold is most remarkably improved when thallium (Tl) is added to the non-cyanide electroless gold plating solution comprising a gold sulfite salt and sodium mercaptoethanesulfonate.

The amount of thallium (Tl) to be added is preferably from 0.1 to 100 ppm.

Using the non-cyanide electroless gold plating solution according to the invention mentioned above, a gold layer 24 is formed, by immersion gold plating, on an exposed surface of a metal layer 22 serving as an underlying layer and made of Ni—P which is exposed at the bottom surface of a concave portion 20 that is opened in the mask layer 18 covering one surface of the substrate 10 as shown in FIG. 1.

At that time, the metal layer 22 serving as an underlying layer and made of Ni—P, which is exposed at the bottom surface of the concave portion 20 of the substrate 10, can be formed by first subjecting the exposed surface of a pad 14 exposed at the bottom surface of the concave portion 20 opened in the mask layer 18 covering one surface of the substrate 10 as shown in FIG. 1 to pre-treatment so as to deposit a catalyst metal such as Pd, and subsequently dipping the thus-pretreated substrate 10 for a predetermined period of time in an electroless nickel plating solution having a phosphorus content of 1 to 4% by weight, preferably 1 to 2% by weight, so-called a low-phosphorus type electroless nickel plating solution.

Then, the resulting substrate 10, in which the metal layer 22 serving as an underlying layer and made of Ni—P has been formed on the exposed bottom surface of the concave portion 20, is dipped in the non-cyanide electroless gold plating solution according to the invention for a predetermined period of time, thereby the gold layer 24 can be formed on the exposed gold surface of the metal layer 22.

In the immersion gold plating, it is preferred to maintain the non-cyanide electroless gold plating solution at 40 to 90° C. while adjusting its pH value to an acidic region of a pH value of 7 or lower, more preferably a pH value of 6 or lower, particularly preferably a pH value of 6 to 3.

After the substrate 10 is thus dipped in the non-cyanide electroless gold plating solution according to the invention for a predetermined period of time, the substrate 10 is taken out of the electroless gold plating solution, washed, and dried.

In the resulting substrate 10, the mask layer 18 is tightly adhered onto one surface of the substrate 10 and a glossy and dense gold layer 24 is formed on the bottom surface of the concave portion 20.

The reason why the glossy and dense gold layer 24 can be formed, with the non-cyanide electroless gold plating solution according to the invention, on the metal layer 22 made of Ni—P formed using the low-phosphorus type electroless nickel plating solution is considered as follows.

In general, at the time of immersion gold plating onto the metal layer 22 made of Ni—P, the displacement reaction represented by the following reaction formulae proceeds.

Since such a displacement reaction proceeds excessively in a cyanide-containing electroless gold plating, erosion generates in the metal layer 22 made of Ni—P that is formed using the low-phosphorus type electroless nickel plating solution, which is low in erosion resistance.

However, in the above-described embodiment of the invention, the gold layer 24 is formed, on the metal layer 22 made of Ni—P and formed using the low-phosphorus type electroless nickel plating solution, using the non-cyanide electroless gold plating solution according to the invention with which the displacement reaction represented by the above reaction formulae mildly proceeds. As a result, the glossy and dense gold layer 24 can be formed while the erosion of the metal layer 22 is prevented.

In this connection, when the non-cyanide electroless gold plating solution according to the invention is used, a glossy and dense gold layer 24 can be formed even on the metal layer 22 that is formed using an electroless nickel plating solution having a phosphorus content of 7 to 9% by weight, i.e., a so-called medium-phosphorus type electroless nickel plating solution.

According to the process for electroless gold plating, on the metal layer 22 made of Ni—P and formed using the so-called low-phosphorus type electroless nickel plating solution on the bottom part of the concave portion 20 of the substrate 10, a gold layer 24 is formed using the non-cyanide electroless gold plating solution according to the invention. And then, on the gold layer 22, a solder piece is mounted and reflowed to form a solder ball 16 as an external connecting terminal.

The bonding strength of the formed solder ball 16 is satisfactory as compared with the case that the gold layer 24 is formed using a cyanide-containing electroless gold plating solution.

Moreover, when the cross-section of the boundary between the solder ball 16 and the metal layer 22 made of Ni—P is observed by a Scanning Electron Microscope (SEM), it can be seen that an intermetallic compound layer (IMC layer) and a P-rich layer are formed at the boundary between the solder layer and the metal layer 22. Since the boundary face between the IMC layer and the P-rich layer is brittle, the boundary face may be broken when applying a tensile force to the solder ball 16, so that the solder ball 16 is peeled off.

EXAMPLES

The present invention will be illustrated in greater detail with reference to the following Examples, but the invention should not be construed as being limited thereto.

Example 1

(1) Preparation of Object to be Plated:

An exposed surface of a copper wiring pattern 12 exposed at the bottom surface of a concave portion 20 opened in a mask layer 18 which covers one surface of the substrate 10 as shown in FIG. 1 was subjected to pre-treatment so as to deposit Pd as a catalyst metal. Thereafter, the substrate 10 was dipped in an electroless nickel plating solution to form a metal layer 22 made of Ni—P and having a thickness of 5 μm. As the electroless nickel plating solution for forming the metal layer 22, a low-phosphorus type electroless nickel plating solution having a phosphorus content of 1 to 2% by weight was used.

(2) Preparation of Electroless Gold Plating Solution:

As electroless gold plating solutions, the electroless gold plating solutions 1 to 5 shown in Table 1 below were prepared.

With the electroless gold plating solution 5, a gold-plated film having a lower degree of gloss was formed even when compared with the gold-plated film formed with the electroless gold plating solution 4, but the gloss was still within an acceptable range (score: A to B).

Example 2

When each of the electroless gold plating solutions 1 to 5 shown in Table 1 was maintained at 60° C. for 9 days, none of the electroless gold plating solutions showed a decomposition phenomenon of the components contained therein. Thus, the solutions were found to be stable.

Separately, the electroless gold plating solution 1 shown in Table 1 was maintained at 80° C. for 4 weeks. Also in this case, the solution showed no decomposition and hence was found to be stable.

Example 3

In the same manner as in Example 1, on a metal layer 22 made of Ni—P as shown in FIG. 1, which had been formed using a low-phosphorus type electroless nickel plating solution having a phosphorus content of 1 to 2% by weight, a gold layer 24 having a thickness of 0.06 μm was formed using the electroless gold plating solution 1 shown in Table 1 of Example 1.

Figure 4:
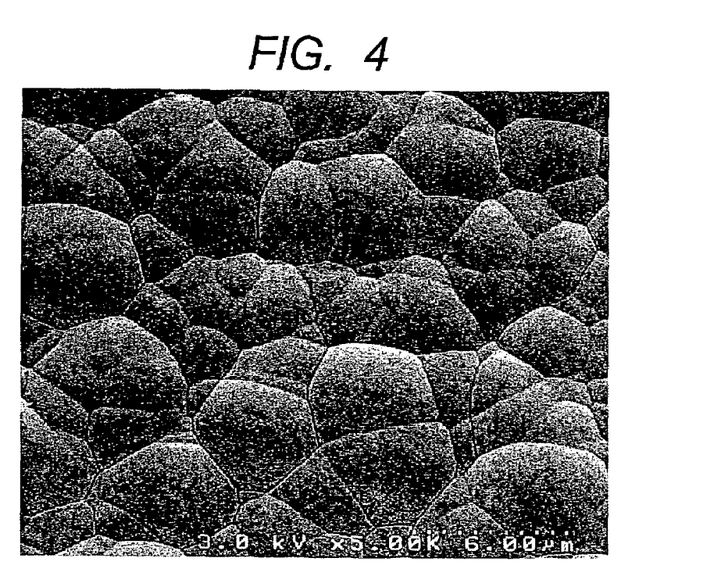
FIG. 4 is a photograph of the surface of a metal layer made of Ni—P, after forming a gold layer thereon using a non-cyanide electroless gold plating solution according to the invention and then dissolving it.

Then, after the gold layer 24 was dissolved using a commercially available gold strip solution, the surface of the metal layer 22 was observed on a SEM (20000 magnifications). As a result, as shown in FIG. 4, no pinholes owing to

TABLE 1

|  |  | Solution 1 | Solution 2 | Solution 3 | Solution 4 | Solution 5 |
|---|---|---|---|---|---|---|
| Gold source | Sodium gold sulfite | 1* g/L |  |  | 1* g/L | 1* g/L |
|  | Sodium chloroaurate |  | 1* g/L | 1* g/L |  |  |
| Complexing agent | Sodium mercaptoethane-sulfonate | 4.17 g/L |  |  | 4.17 g/L | 4.17 g/L |
|  | Sodium mercaptopropane-sulfonate |  | 4.50 g/L |  |  |  |
|  | Aminoethane-thiol |  |  | 1.90 g/L |  |  |
| Conductive salt | Monopotassium citrate | 50 g/L | 50 g/L | 50 g/L | 50 g/L | 50 g/L |
|  | Tripotassium citrate | 40 g/L | 40 g/L | 40 g/L | 40 g/L | 40 g/L |
| pH adjuster | Potassium hydroxide | pH 5 | pH 5 | pH 5 | pH 7 | pH 13 |
| Plating temperature (° C.) |  | 80 | 80 | 80 | 80 | 80 |
| Appearance of plated film |  | AA | AA | AA | A | A to B |
| Stability of plating solution |  | A | A | A | A | A |

Note:
*amount in terms of gold (3) Electroless Gold Plating

The prepared object to be plated was dipped in the respective solutions 1 to 5 shown in Table 1 to form a gold layer 24 having a thickness of 0.06 μm on the Ni—P layer 22.

The results from visual observation of the appearance of the formed gold layer 24 were also shown in Table 1. With each of the electroless gold plating solutions 1 to 3, it was possible to form gold-plated films showing extremely good gloss (score: AA).

With the electroless gold plating solution 4, a gold-plated film having a lower degree of gloss was formed as compared with the gold-plated films formed with the electroless gold plating solutions 1 to 3, but the gloss was still good (score: A).

erosion upon the displacement reaction of nickel with gold were observed on the surface of the metal layer 22 and the surface was an even surface.

Comparative Example 1

In the same manner as in Example 1, on a metal layer 22 made of Ni—P as shown in FIG. 1, which had been formed using a low-phosphorus type electroless nickel plating solution having a phosphorus content of 1 to 2% by weight, a gold layer 24 having a thickness of 0.06 μm was formed using the cyanide-containing electroless gold plating solution specified in Table 2 below.

Figure 5:
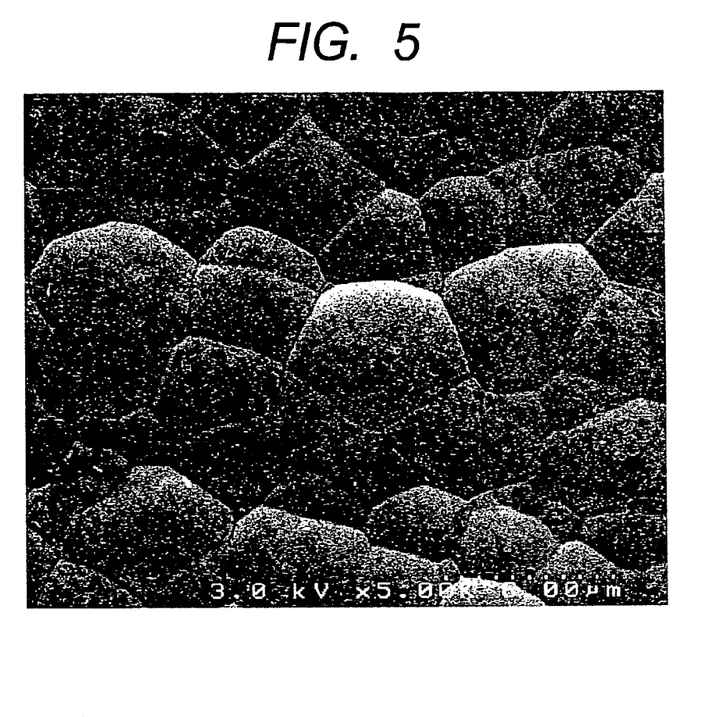
FIG. 5 is a photograph of the surface of a metal layer made of Ni—P, after forming a gold layer thereon using a cyanide-containing electroless gold plating solution and then dissolving it.

Then, after the gold layer 24 was dissolved using a commercially available gold strip solution, the surface of the metal layer 22 was observed on a SEM (20000 magnifications). As a result, as shown in FIG. 5, a large number of pinholes with small diameter owing to erosion upon the displacement reaction of nickel with gold were observed on the surface of the metal layer 22.

TABLE 2

| | |
|---|---|
| Triammonium citrate | 20 g/L |
| EDTA · 2NH₃ | 25 g/L |
| KAu(CN)₂ | 5 g/L |
| Ammonia water (pH adjuster) | pH 6.5 |
| Plating temperature | 80° C. |

Comparative Example 2

A gold layer 24 having a thickness of 0.06 μm was formed in the same manner as in Comparative Example 1, except that a metal layer 22 made of Ni—P as shown in FIG. 1 was formed using an electroless nickel plating solution having a phosphorus content of 7 to 9% by weight.

Figure 6:
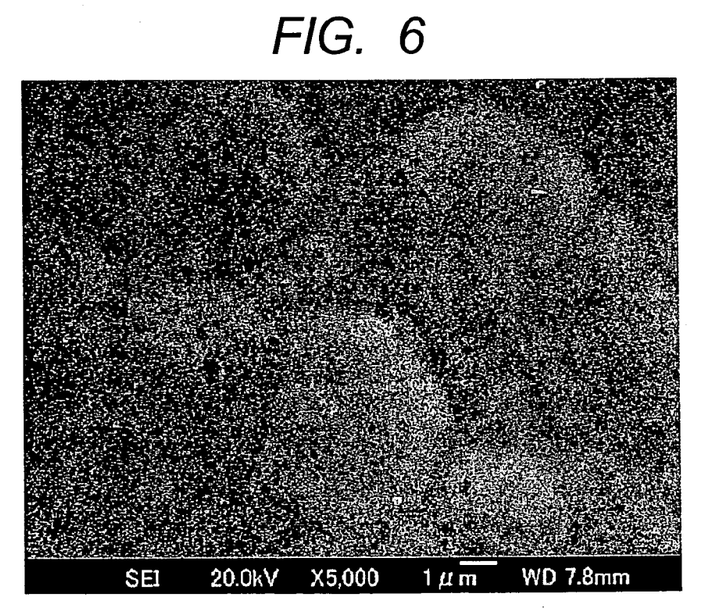
FIG. 6 is a photograph of the surface of a metal layer made of Ni—P, after forming a gold layer thereon using a cyanide-containing electroless gold plating solution and then dissolving it, wherein the metal layer was formed with a medium-phosphorus type electroless nickel plating solution having a phosphorus content of 7 to 9% by weight.

Then, after the gold layer 24 was dissolved using a commercially available gold strip solution, the surface of the metal layer 22 was observed on a SEM (20000 magnifications). As a result, as shown in FIG. 6, a large number of pinholes which was formed by erosion upon the displacement reaction of nickel with gold and had larger diameters than those of the pinholes formed on the surface of the metal layer 22 in Comparative Example 1 shown in FIG. 5 were observed on the surface of the metal layer 22.

Example 4

Thallium sulfate was added to the electroless gold plating solution 1 in Table 1 of Example 1 so as to be in a concentration of 10 ppm in terms of thallium (Tl). Then, a substrate 10 as shown in FIG. 1 was dipped for a predetermined period of time in the electroless gold plating solution to which thallium (Tl) was added, and thereby, electroless gold plating was performed on the metal layer 22 made of Ni—P under the same conditions as in the case of the electroless plating shown in solution 1 of Table 1.

Then, the substrate 10 was taken out of the electroless gold plating solution and the thickness of the gold-plated film formed on the metal layer 22 was measured by means of an X-ray fluorescence thickness meter. Curve F in FIG. 7 shows the relationship between the plating time of the substrate 10 in the electroless gold plating solution to which thallium (Tl) was added and the thickness of the gold-plated film.

Figure 7:
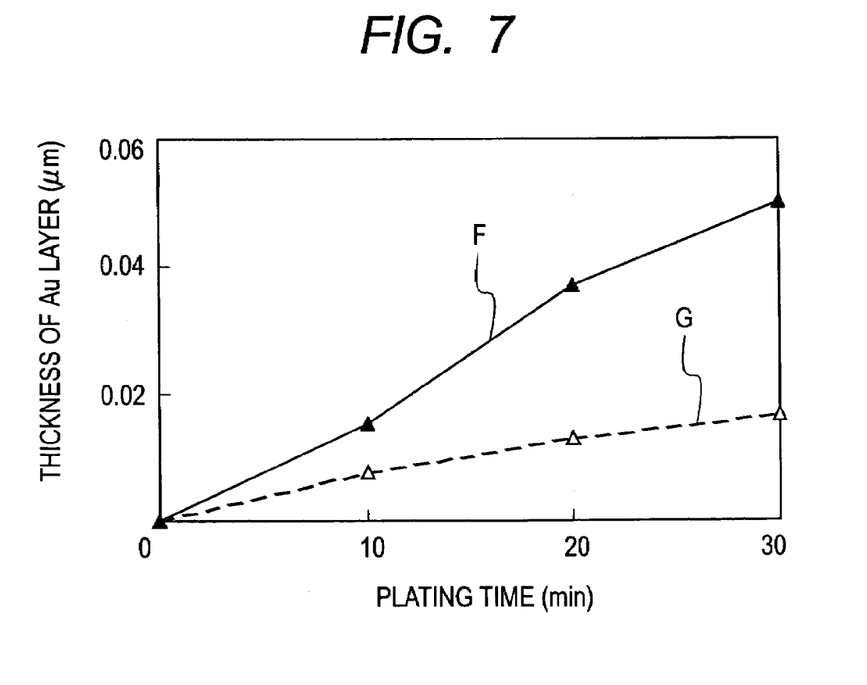
FIG. 7 is a graph illustrating a deposition rate of gold in each of an electroless gold plating solution to which thallium (Tl) is added and an electroless gold plating solution to which thallium (Tl) is not added.

On the other hand, using the electroless gold plating solution 1 in Table 1 to which thallium was not added, the relationship between the plating time of the substrate 10 and the thickness of the gold-plated film formed on the metal layer 22 made of Ni—P was similarly investigated and the results were shown as Curve G in FIG. 7.

As is apparent from FIG. 7, with the electroless gold plating solution to which thallium (Tl) was added, the deposition rate of gold plated on the metal layer 22 made of Ni—P of the substrate 10 can be made more rapid than the case of using the electroless gold plating solution to which thallium (Tl) was not added.

Example 5

In the same manner as in Example 1, on a metal layer 22 made of Ni—P as shown in FIG. 1 formed using a low-phosphorus type electroless nickel plating solution having a phosphorus content of 1 to 2% by weight, a gold layer 24 having a thickness of 0.06 μm was formed using the electroless gold plating solution 1 in Table 1 of Example 1. Thereafter, a solder ball 16 was formed on the gold layer 24 by placing a solder piece thereon and reflowing it. This solder ball 16 is hereinafter referred to as "solder ball 16 (Example)" or "Example".

In addition, in the same manner as in Example 1, on a metal layer 22 made of Ni—P as shown in FIG. 1 formed using a low-phosphorus type electroless nickel plating solution having a phosphorus content of 1 to 2% by weight, a gold layer 24 having a thickness of 0.06 μm was formed using the cyanide-containing electroless gold plating solution shown in Table 2. Thereafter, a solder ball 16 was formed on the gold layer 24 by placing a solder piece thereon and reflowing it. This solder ball 16 is hereinafter referred to as "solder ball 16 (Comparative Example I)" or "Comparative Example I".

Furthermore, a gold layer 24 having a thickness of 0.06 μm was formed in the same manner as in Comparative Example 1, except that the metal layer 22 made of Ni—P as shown in FIG. 1 was formed using an electroless nickel plating solution having a phosphorus content of 7 to 9% by weight. Thereafter, a solder ball 16 was formed on the gold layer 24 by placing a solder piece thereon and reflowing it. This solder ball 16 is hereinafter referred to as "solder ball 16 (Comparative Example II)" or "Comparative Example II".

Each of the "solder ball 16 (Example)", "solder ball 16 (Comparative Example I)", and "solder ball 16 (Comparative Example II)" mounted on the respective gold layer 24 was subjected to a ball pull test to measure the situation in which the solder ball 16 was broken by a tensile force and also measure the breaking strength. The results are shown in FIG. 8 and FIG. 9.

Figure 8:
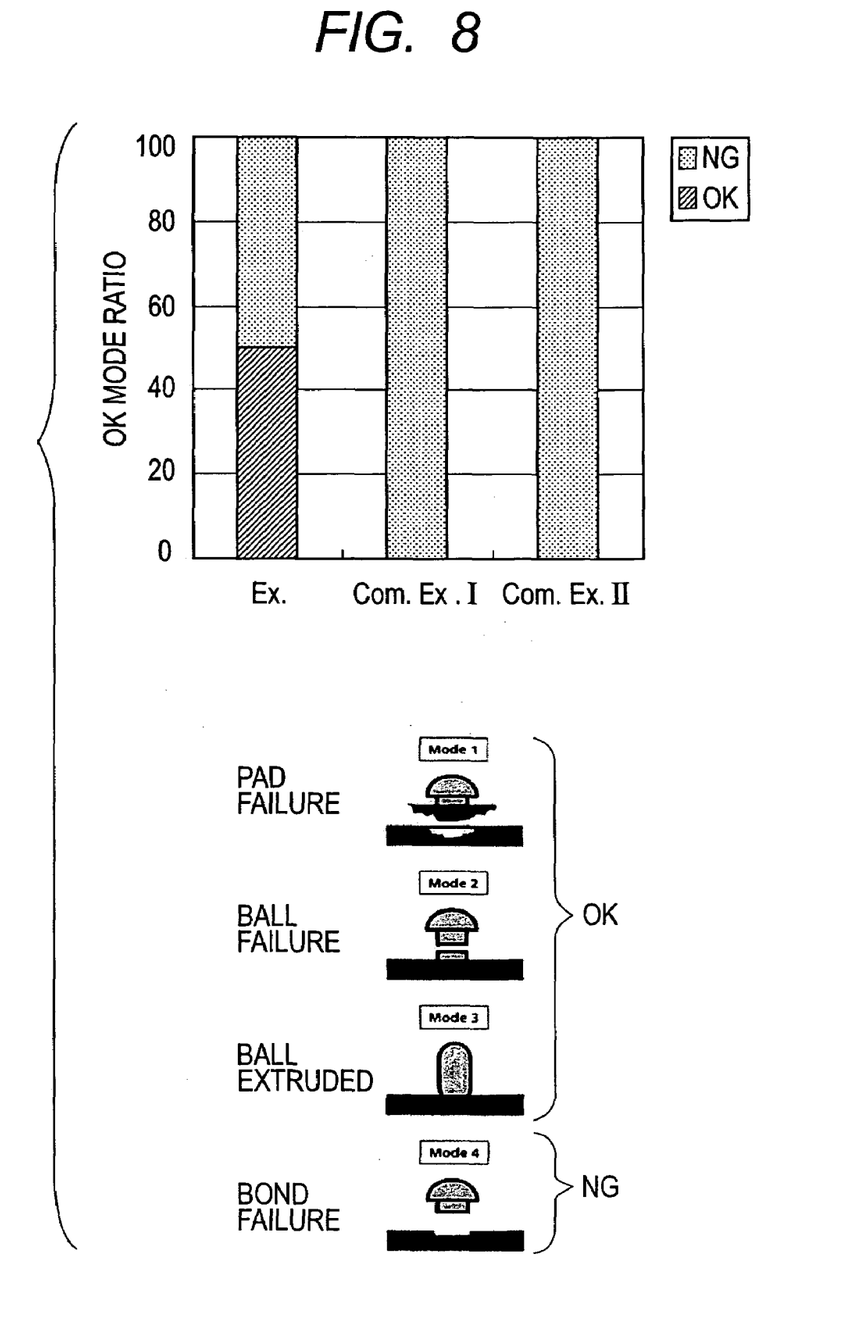
FIG. 8 is a graph illustrating a broken mode of a solder ball when a tensile force is applied to the solder ball formed on a gold layer formed by electroless gold plating.
Figure 9:
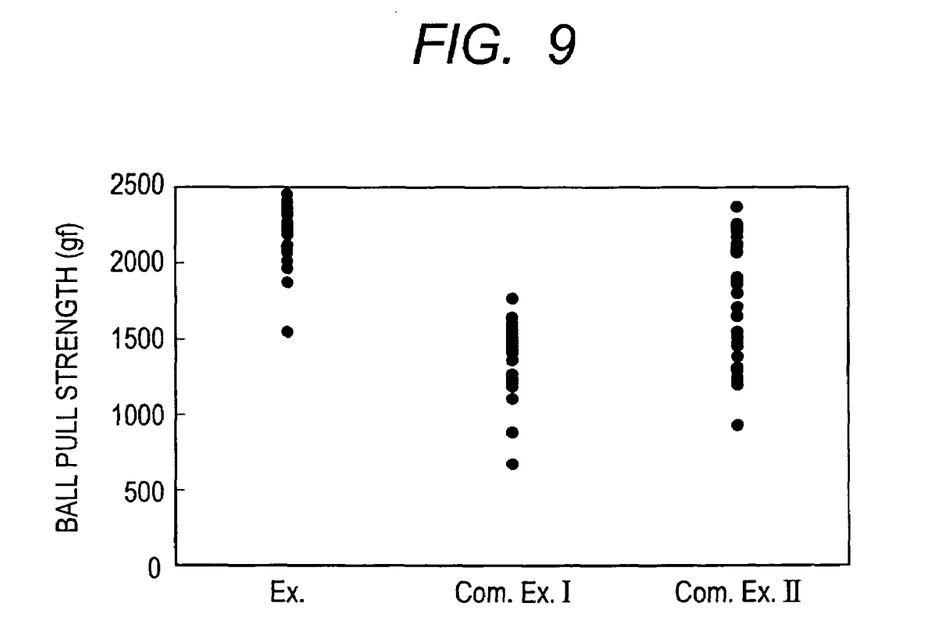
FIG. 9 is a graph illustrating breaking strength (ball pull strength) at which the solder ball is broken when a tensile force is applied to the solder ball formed on a gold layer formed by electroless gold plating.

First, the situation in which the solder ball 16 was broken by a tensile force was classified into Mode 1 to Mode 4 as shown in FIG. 8. The broken situations of Mode 1 to Mode 3 are attributable to the breakage of the solder ball 16 itself or the breakage of the metal layer 22 on which the solder ball is mounted and thus are not attributed to the peeling between the solder ball 16 and the metal layer 22. Therefore, these modes are rated as acceptable (OK).

On the other hand, the broken situation of Mode 4 corresponds to the breakage attributable to peeling between the solder ball 16 and the metal layer 22, so that this mode is rated as failure (NG).

With regard to the situation in which the solder ball 16 was broken by such a tensile force, as shown in FIG. 8, the rate where the broken situations were rated as acceptable (OK) was about 50% for the solder ball 16 (Example), whereas all the samples were rated as unacceptable (NG) for the solder ball 16 (Comparative Example I) and the solder ball 16 (Comparative Example II).

Moreover, FIG. 9 shows the results of measurement of breaking strength (ball pull strength) at which the solder ball 16 was broken. As shown in FIG. 9, the ball pull strength of the "solder ball 16 (Example)" is high in its average value and the data dispersion is small as compared with the "solder ball 16 (Comparative Example I)" and the "solder ball 16 (Comparative Example II)".

Figure 10A:
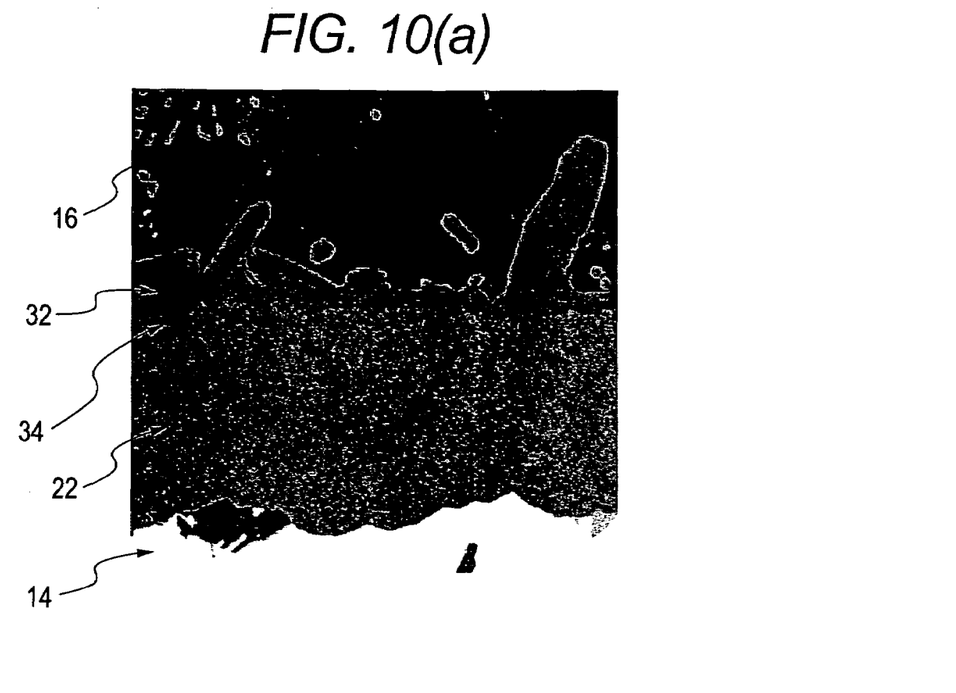
FIGS. 10(a) and 10(b) are photographs on the cross-section in the vicinity of the boundary between the metal layer and the solder ball.

Furthermore, after the solder ball 16 was formed on the gold layer 24, the cross-section in the vicinity of the boundary between the metal layer 22 made of Ni—P and the solder ball 16 was observed on a photograph. FIG. 10(a) is the photograph for the solder ball 16 (Example) and FIG. 10(b) is the photograph for the solder ball 16 (Comparative Example II).

Figure 10B:
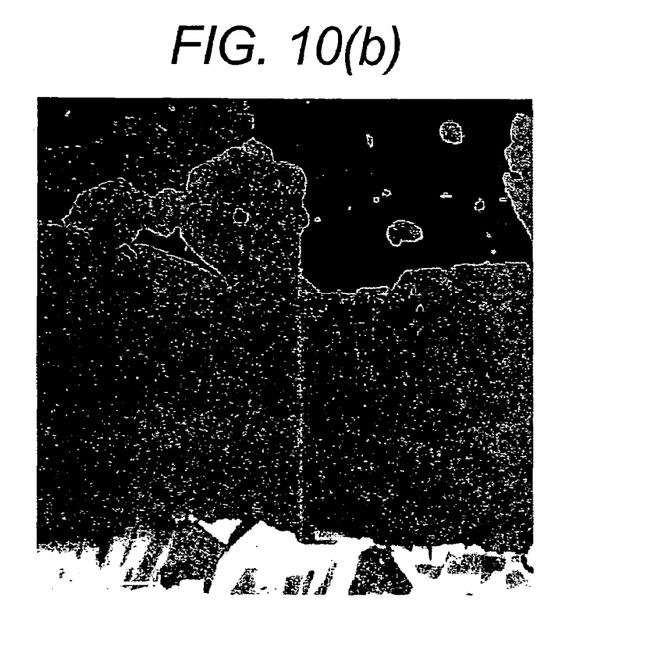

In FIGS. 10(a) and 10(b), on a pad 14 made of copper, an intermetallic compound layer 32 and a P-rich layer 34 are formed at the boundary part between the metal layer 22 made of Ni—P and the solder ball 16. The interface between the intermetallic compound layer 32 and the P-rich layer 34 is brittle and the solder ball 16 is apt to be peeled off from the interface when a tensile force is applied to the ball.

However, as is apparent from FIGS. 10(a) and 10(b), the P-rich layer 34 of the solder ball 16 (Example) shown in FIG. 10(a) is thinner than the P-rich layer 34 of the solder ball 16 (Comparative Example II) shown in FIG. 10(b). Therefore, in the solder ball 16 (Example) shown in FIG. 10(a), the ball is considered to be difficult to peel off at the interface between the intermetallic compound layer 32 and the P-rich layer 34.

While the present invention has been described in detail and with reference to specific embodiments thereof, it will be apparent to one skilled in the art that various changes and modifications can be made therein without departing from the spirit and scope thereof.

This application is based on Japanese Patent Application Nos. 2004-271112 (filed Sep. 17, 2004) and 2005-005266 (filed Jan. 12, 2005), the contents thereof being herein incorporated by reference.

What is claimed is:

1. A process for electroless gold plating, comprising forming a gold layer, by electroless gold plating, on a surface of a pad for mounting a solder ball, which pad comprises an end part of a wiring pattern, wherein the gold layer is formed on a metal layer comprising Ni—P on the pad exposed at a bottom surface of a concave portion that is opened in a resinous mask layer covering one surface of a substrate, wherein the metal layer is formed on the pad using an electroless nickel plating solution having a phosphorous content of 1% to 4% by weight, and wherein the electroless gold plating is carried out by dipping the substrate in a non-cyanide electroless gold plating solution comprising, as a complexing agent of gold, a compound represented by the formula shown below or a salt thereof: $X-(CH_2)_n-SH$ wherein n is 2 or 3 and X is $SO_3H$ or $NH_2$, and having a pH value of 7 or less.

2. A process for forming a gold layer by plating on a surface of a pad for mounting a solder ball, which pad constitutes an end part of a wiring pattern, comprising:
    forming a concave portion in a resinous mask layer so as to expose the pad at the bottom of the concave portion;
    forming a metal layer comprising Ni—P on the exposed pad with an electroless plating solution having a phosphorous content of 1% to 4% by weight; and
    forming the gold layer on the metal layer with a non-cyanide electroless gold plating solution comprising, as a complexing agent of gold, a compound represented by the formula shown below or a salt thereof: $X-(CH_2)_n-SH$ wherein n is 2 or 3 and X is $SO_3H$ or $NH_2$, and having a pH value of 7 or less.

3. The process according to claim 2 wherein the complexing agent of gold is sodium mercaptoethanesulfonate, sodium mercaptopropanesulfonate, or aminoethanethiol.

4. The process according to claim 2 wherein the electroless gold plating solution further comprises thallium (Tl) as a grain refiner.

5. The process according to claim 2 wherein the electroless gold plating solution further comprises a gold sulfite salt or a chloroaurate salt as a gold source.

* * * * *